(12) United States Patent
Farcy et al.

(10) Patent No.: US 8,410,574 B2
(45) Date of Patent: Apr. 2, 2013

(54) INTEGRATED MICROELECTRONIC DEVICE WITH THROUGH-VIAS

(75) Inventors: Alexis Farcy, La Ravoire (FR); Maxime Rousseau, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 339 days.

(21) Appl. No.: 12/961,730

(22) Filed: Dec. 7, 2010

(65) Prior Publication Data

US 2011/0140231 A1 Jun. 16, 2011

(30) Foreign Application Priority Data

Dec. 10, 2009 (FR) ...................... 09 58852

(51) Int. Cl.
  *H01L 29/00* (2006.01)
  *H01L 23/48* (2006.01)
  *H01L 23/52* (2006.01)
  *H01L 29/40* (2006.01)
(52) U.S. Cl. ............. 257/508; 257/774; 257/E23.141; 257/E29.018
(58) Field of Classification Search ........... 257/508, 257/774, E23.141, E29.018
See application file for complete search history.

(56) References Cited

U.S. PATENT DOCUMENTS

| 2009/0191708 A1 | 7/2009 | Kropewnicki et al. |
| 2009/0289324 A1 | 11/2009 | Goodlin et al. |
| 2010/0164055 A1* | 7/2010 | Miyakawa et al. ........... 257/508 |
| 2012/0326330 A1* | 12/2012 | Pratt ........................ 257/774 |

FOREIGN PATENT DOCUMENTS

| FR | 2930840 A1 | 11/2009 |
| WO | WO-95/31006 A1 | 11/1995 |

OTHER PUBLICATIONS

International Search Report, mailed Jul. 20, 2010, for FR 0958852 (2 pages).

* cited by examiner

*Primary Examiner* — David S Blum
(74) *Attorney, Agent, or Firm* — Gardere Wynne Sewell LLP

(57) ABSTRACT

An integrated microelectronic device is formed from a substrate having a first side and a second side and including a doped active zone (2) in the first side of the substrate. A circuit component is situated in the doped active zone. A through silicon via extends between the second side and the first side, the via being electrically isolated from the substrate by an insulating layer. A buffer zone is situated between the insulating layer and the doped active zone. This buffer zone is positioned under a shallow trench isolation zone provided around the doped active zone. The buffer zone functions to reduce the electrical coupling between the through silicon via and the doped active zone.

13 Claims, 3 Drawing Sheets

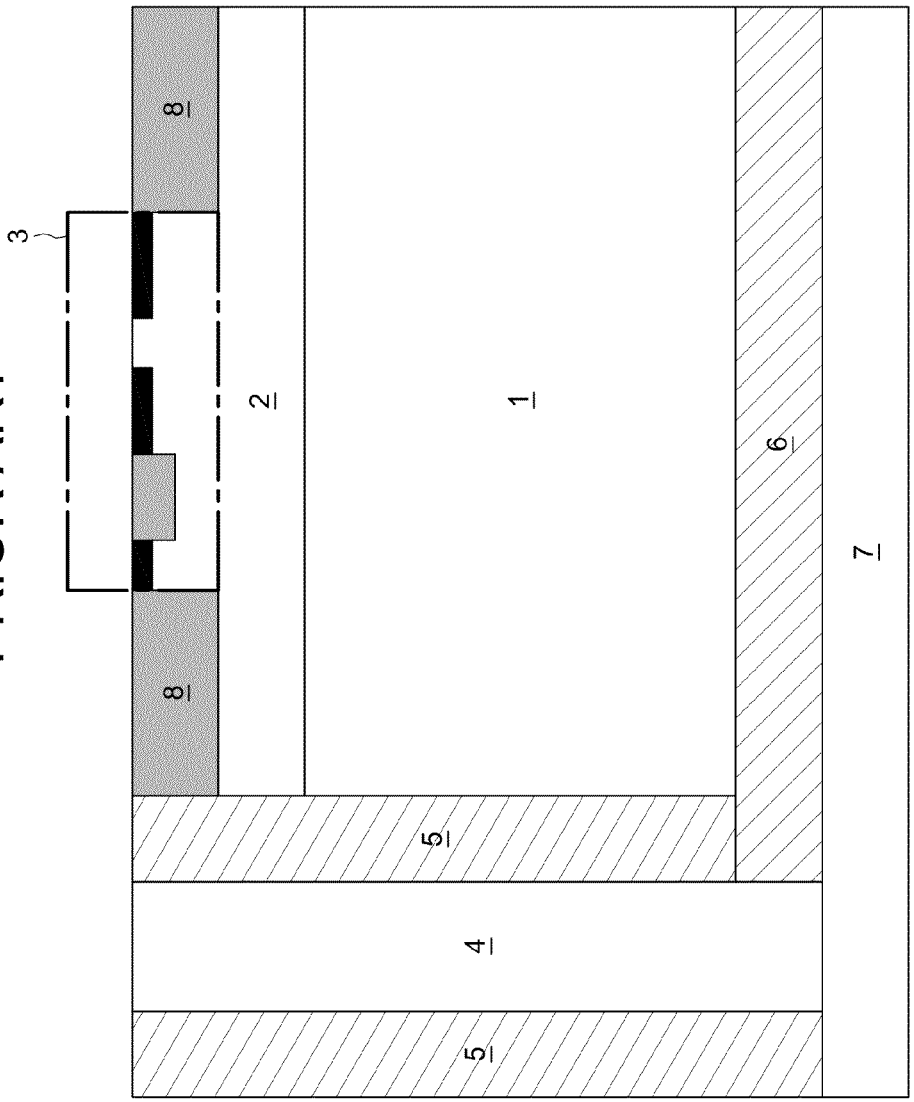

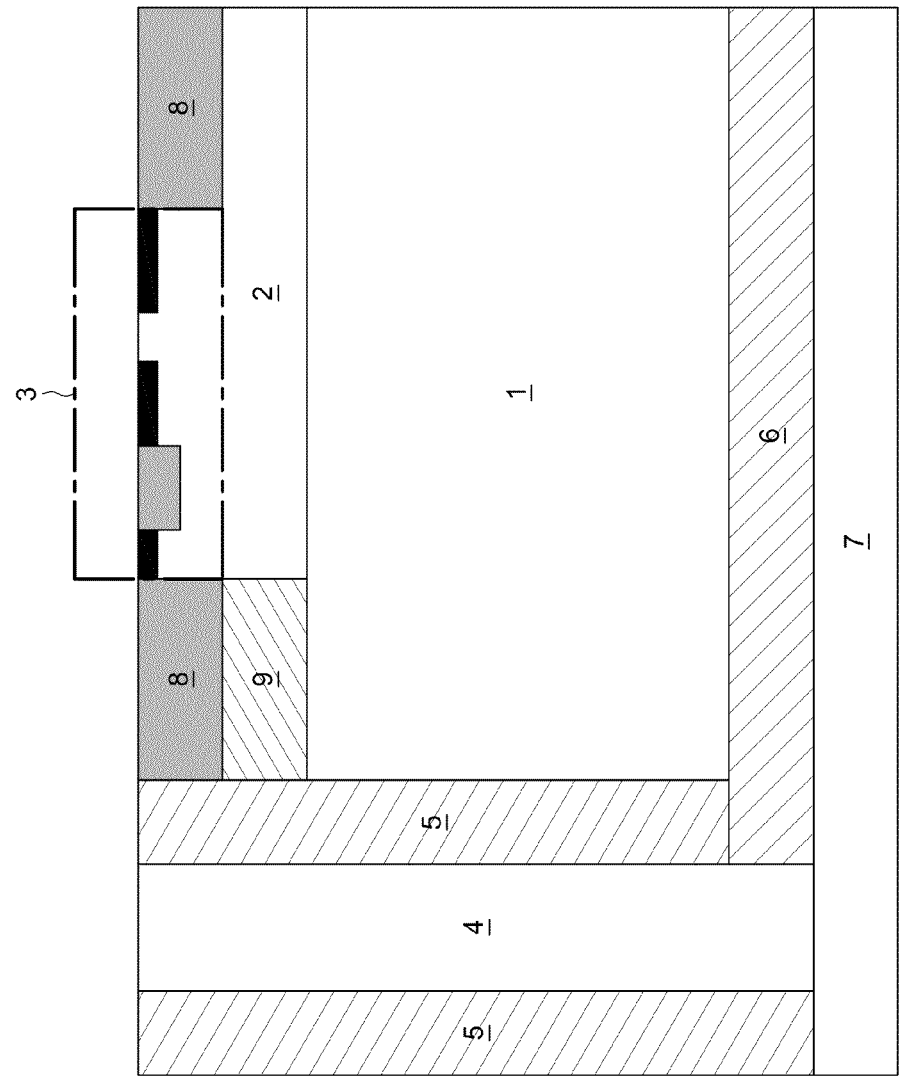

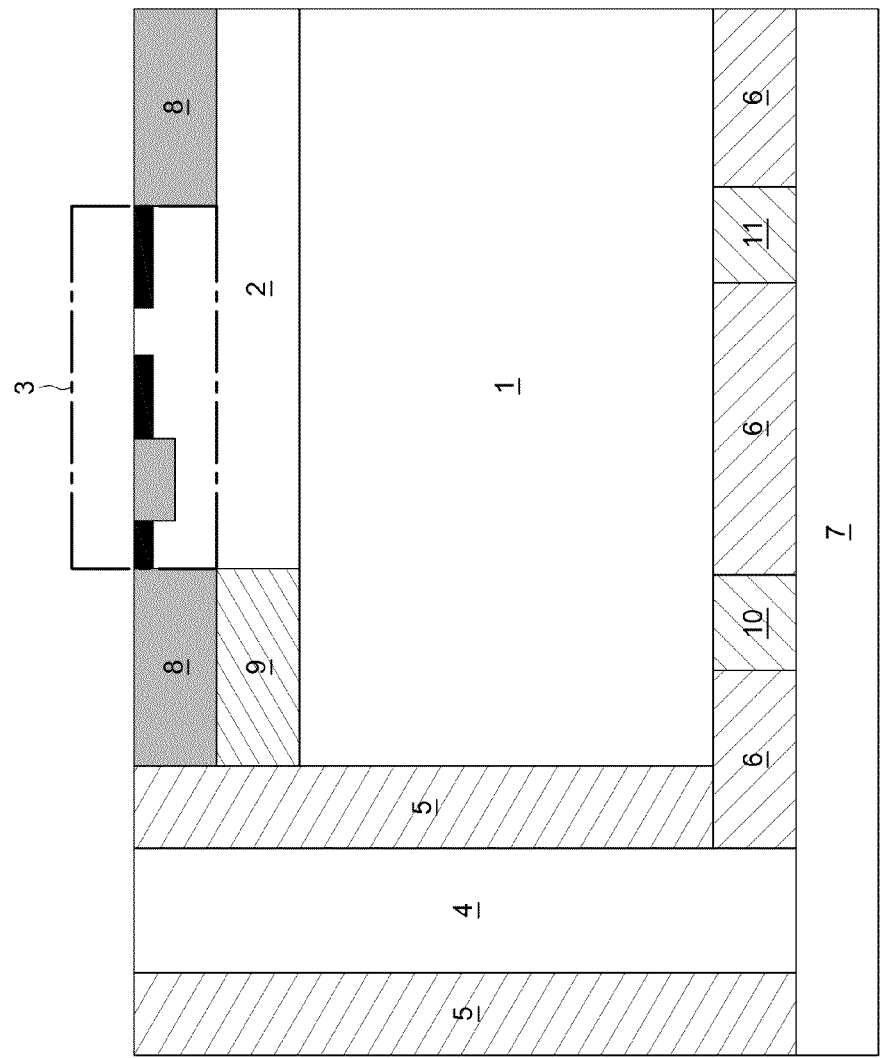

INTEGRATED MICROELECTRONIC DEVICE WITH THROUGH-VIAS

PRIORITY CLAIM

This application claims priority from French Application for Patent No. 09-58852, filed Dec. 10, 2009, the disclosure of which is hereby incorporated by reference.

TECHNICAL FIELD

The invention relates to the field of microelectronic devices and more particularly to electrical coupling in microelectronic devices comprising at least one electrically conductive through-via, commonly called by those skilled in the art a through-silicon via or TSV.

BACKGROUND

The integration of microelectronic devices is a major challenge on account of the investments associated with novel technologies. Integration has conventionally advanced by a reduction in the size of transistors, the elementary building blocks of most microelectronic devices. However, the reduction in component size is reaching its limits; quantum effects associated with the size reduction are becoming preponderant and not easily managed with current technologies. Another approach to integration that has been investigated comprises the production of active components on both sides of a substrate so as to increase the surface density thereof. To allow communication between the components on both sides, it is necessary to use electrically conductive through-vias that connect the two sides of the substrate.

Another application of through-vias is in the interconnection of stacked integrated circuits.

Through-vias can also be used to connect components situated on one side of the substrate to connection bumps on the other side of the substrate.

Although the through-vias are electrically isolated, electrical coupling with nearby active components can occur, degrading their performance.

SUMMARY

According to one embodiment of the invention, an integrated microelectronic device having reduced electrical coupling near the through-vias is proposed, thus allowing better interconnection between various chips.

According to one aspect, the invention provides an integrated microelectronic device comprising a substrate having a first side and a second side, at least one component situated on the first side and possessing a doped active zone in the substrate and at least one electrically conductive through-via connecting the second side to the first side and electrically isolated from the substrate by an insulating layer; according to a general feature of this aspect, the device comprises a buffer zone situated between said insulating layer and said doped active zone, different from the insulating layer and from the doped active zone, and placed so as to reduce the electrical coupling between the electrically conductive through-via and the doped active zone.

According to an embodiment, the buffer zone may be advantageously a conductive layer situated between the insulating layer of the conductive through-via and the doped active zone. Moreover, the buffer zone may be in contact with said insulating layer and said doped active zone.

The buffer zone may be a zone less conductive, for example less doped, than the doped active zone.

The buffer zone may be part of the substrate

The buffer zone may extend to a depth at least equal to the thickness of the doped active zone.

The device may also comprise a shallow trench isolation (or STI) zone between the component and the insulating layer, the buffer zone extending beneath the shallow isolation zone.

The substrate may also be configured to be electrically coupled to ground. This allows the electrical coupling to be still further reduced, which is particularly beneficial for radiofrequency applications.

The device may thus, for example, comprise a redistribution layer designed to be grounded, and electrically coupled to the substrate by means of at least one contact.

BRIEF DESCRIPTION OF THE DRAWINGS

Other aims, features and advantages of the invention will become clear on reading the following description, given merely by way of non-limiting example and with reference to the appended drawings in which:

FIG. 1 illustrates the principal elements of an electronic device comprising a through-via;

FIG. 2 illustrates the principal elements of an electronic device comprising a through-via according to one embodiment of the invention; and FIG. 3 illustrates the principal elements of an electronic device comprising a through-via according to another embodiment of the invention.

DETAILED DESCRIPTION OF THE DRAWINGS

In FIG. 1, the integrated microelectronic device comprises a substrate 1, for example a bulk or thinned, p⁻-doped substrate. On its lower side, the substrate 1 may be electrically isolated from the surroundings by a lower insulation layer 6. Near the upper side, the substrate comprises a doped active zone 2 the dopant concentration of which is higher than the dopant concentration of the substrate 1.

A component 3 is produced in and on this doped active zone 2. The component 3 may be a transistor comprising a source region, a drain region and a gate. Although only one component 3 is represented in FIG. 1, other components may also be present on the surface of the substrate 1. In order to separate two adjacent components, it is usual to employ shallow trench isolations (STIs) 8.

To access the lower side of the component, for example to allow connection to connection bumps or to allow electrical interconnection between various stacked chips or stacked integrated circuits, electrically conductive through-vias 4 are used. In FIG. 1 a through-via 4 linking the frontside of the device to the back side may be seen. So as to electrically isolate the through-via 4 from the substrate 1 and/or from the doped active zone 2, an insulation layer 5, for example an oxide, is provided around the through-via 4. The substrate 1 may also comprise on its back side another conductive layer, for example a redistribution layer, designed to be connected, for example, to ground.

In operation, electrical coupling occurs between the through-via 4 and, at the same time, the doped active zone 2 and the substrate 1. Since the doped active zone 2 is more conductive than the substrate 1, because of the doping, the coupling is then greater between the through-via 4 and the doped active zone 2 than between the through-via 4 and the substrate. The electrical coupling creates electrical noise detrimental to the operation of the component 3.

Because of the integration constraints and the thermal budget of the subsequent steps, it is not possible to use a conventional metal screen.

FIG. 2 illustrates an example of a device similar to that illustrated in FIG. 1 but offering a reduction in the electrical coupling. To this end, a buffer zone 9 is formed between the through-via 4 and the doped active zone 2 so as to electrically decouple them.

The buffer zone 9 is formed by a material more insulating than the doped active zone 2. The buffer zone 9 may also be part of the substrate 1. The buffer zone 9 allows the coupling wave between the through-via 4 and the doped active zone 2 to be dissipated.

In this example, the buffer zone 9 extends beneath the isolation trench 8 to a depth equal to that of the doped active zone. In practice, this buffer zone, which here is part of the substrate 1, may be obtained by not doping this zone during the production of the doped active zone. This being so, another solution might consist in the integration of the buffer zone 9 without the presence of shallow trench isolations 8.

It is thus possible to reduce the electrical coupling by around 50% with respect to a device as in FIG. 1.

FIG. 3 illustrates another embodiment, in which the device also comprises a connection to the redistribution layer 7, for example connected to ground. The connection may be produced by a continuous or intermittent contact (10, 11) between the substrate 1 and the redistribution layer 7. The contacts may be made of copper or tungsten so as to combine both a good contact and a small difference in work function between the substrate 1 and the connections (10, 11).

The connections (10, 11) to the redistribution layer 7 allow the absorption and the channeling of the coupling wave emitted near the through-via 4. The coupling between the through-via 4 and the doped active zone 2 is thus further reduced to the gain of coupling between the through-via 4 and the redistribution layer 7.

The buffer zone and the connection of the substrate to ground may be used separately or in combination so as to obtain even greater protection from electrical coupling. Thus, in the case of FIG. 3, which combines a buffer zone 9 and a connection of the substrate to ground, an additional reduction in electrical coupling of around 30% may be obtained.

The invention may be applied to any technology using a through-via, for example image sensor technologies, particularly image sensors with back side illumination, radiofrequency and millimeter wave technologies and three-dimensional microelectronic technologies.

What is claimed is:

1. An integrated microelectronic device, comprising:
   a substrate having a first side and a second side;
   at least one component situated on the first side and possessing a doped active zone in the substrate;
   at least one electrically conductive through-via connecting the second side of the substrate to the first side, said through-via and electrically isolated from the substrate by an insulating layer;
   a buffer zone situated between said insulating layer and said doped active zone, the buffer zone being different from the insulating layer and different from the doped active zone, the buffer zone placed so as to reduce electrical coupling between the electrically conductive through-via and the doped active zone.

2. The device according to claim 1, wherein the buffer zone is a zone less conductive than the doped active zone.

3. The device according to claim 1, wherein the buffer zone is part of the substrate.

4. The device according to claim 1, wherein the buffer zone extends to a depth at least equal to a thickness of the doped active zone.

5. The device according to claim 1, further comprising an isolation zone of the shallow trench type between the component and the insulating layer, the buffer zone extending beneath the shallow isolation zone.

6. The device according to claim 1, wherein the substrate is also configured to be electrically coupled to ground.

7. The device according to claim 6, further comprising a redistribution layer designed to be coupled to ground and electrically coupled to the substrate by means of at least one contact.

8. An integrated microelectronic device, comprising:
   a substrate having a bottom side and a top side, the substrate include a doped active zone supporting microelectronic circuits, the doped active zone extending from the top side to a first depth and a bulk region extending at least from the first depth to the bottom side;
   a shallow trench isolation zone adjacent the doped active zone and extending from the top side to a second depth shallower than the first depth;
   a buffer zone underneath the shallow trench isolation zone and extending from the second depth to at least the first depth;
   a through silicon via extending between the top side and the bottom side, the through silicon via lined with an insulating layer which is adjacent the shallow trench isolation zone and buffer zone.

9. The device according to claim 8, wherein the buffer zone is a zone less conductive than the doped active zone.

10. The device according to claim 8, wherein the buffer zone is an insulating zone of the bulk region.

11. The device according to claim 8, further comprising a lower insulation layer on the bottom side of the substrate, the through silicon via extending through said lower insulation layer.

12. The device according to claim 11, further comprising at least one electrical connection extending through the lower insulation layer and connecting to the bottom side of the substrate.

13. The device according to claim 12, further comprising a distribution layer on the lower insulation layer, the distribution layer electrically connecting the through silicon via to the at least one electrical connection.

* * * * *